(12) United States Patent
Menard et al.

(10) Patent No.: US 11,362,204 B2
(45) Date of Patent: Jun. 14, 2022

(54) VERTICAL THYRISTOR

(71) Applicant: STMicroelectronics (Tours) SAS, Tours (FR)

(72) Inventors: Samuel Menard, Chauray (FR); Lionel Jaouen, St. Cyr sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 28 days.

(21) Appl. No.: 16/706,201

(22) Filed: Dec. 6, 2019

(65) Prior Publication Data

US 2020/0203516 A1    Jun. 25, 2020

(30) Foreign Application Priority Data

Dec. 20, 2018  (FR) ....................... 1873566

(51) Int. Cl.
| | |
|---|---|
| *H01L 29/74* | (2006.01) |
| *H01L 29/749* | (2006.01) |
| *H01L 29/06* | (2006.01) |
| *H01L 29/08* | (2006.01) |

(52) U.S. Cl.
CPC ........ *H01L 29/749* (2013.01); *H01L 29/0692* (2013.01); *H01L 29/0839* (2013.01)

(58) Field of Classification Search
CPC ............... H01L 29/749; H01L 29/0692; H01L 29/0839; H01L 29/102; H01L 29/42308; H01L 29/74; H01L 29/0834
USPC ...................................................... 257/107
See application file for complete search history.

(56) References Cited

U.S. PATENT DOCUMENTS

| | | | | |
|---|---|---|---|---|
| 3,975,754 | A * | 8/1976 | Lehmann ............ | H01L 29/7428 257/160 |
| 4,180,416 | A * | 12/1979 | Brock ............... | H01L 21/76245 438/441 |
| 5,977,570 | A * | 11/1999 | Takahashi ........... | H01L 29/0696 257/136 |
| 8,835,975 | B1 * | 9/2014 | Veeramma .......... | H01L 29/0619 257/109 |
| 9,741,839 | B1 * | 8/2017 | Nakagawa .......... | H01L 29/0839 |
| 2003/0201455 | A1 * | 10/2003 | Takahashi ........... | H01L 29/0692 257/136 |

(Continued)

FOREIGN PATENT DOCUMENTS

| | | |
|---|---|---|
| EP | 3304600 A1 | 12/2016 |
| FR | 2254880 A1 | 7/1975 |
| FR | 2516704 A1 | 5/1983 |

OTHER PUBLICATIONS

INPI Search Report and Written Opinion for FR 1873566 dated Sep. 9, 2019 (8 pages).

*Primary Examiner* — Sheikh Maruf

(74) *Attorney, Agent, or Firm* — Crowe & Dunlevy

(57) ABSTRACT

A thyristor is formed from a vertical stack of first, second, third, and fourth semiconductor regions of alternated conductivity types. The fourth semiconductor region is interrupted in a gate area of the thyristor. The fourth semiconductor region is further interrupted in a continuous corridor that extends longitudinally from the gate area towards an outer lateral edge of the fourth semiconductor region. A gate metal layer extends over the gate area of the thyristor. A cathode metal layer extends over the fourth semiconductor region but not over the continuous corridor.

26 Claims, 6 Drawing Sheets

(56) References Cited

U.S. PATENT DOCUMENTS

| | | | | |
|---|---|---|---|---|
| 2005/0253170 A1* | 11/2005 | Akiyama | ............... | H01L 29/404 |
| | | | | 257/211 |
| 2008/0164490 A1* | 7/2008 | Rahimo | ................ | H01L 29/102 |
| | | | | 257/E21.388 |
| 2008/0296613 A1* | 12/2008 | Chuang | ............... | H01L 29/7436 |
| | | | | 257/173 |
| 2008/0308837 A1* | 12/2008 | Gauthier, Jr | ........ | H01L 27/0262 |
| | | | | 257/107 |
| 2009/0309132 A1* | 12/2009 | Cai | ..................... | H01L 29/7394 |
| | | | | 257/E21.388 |
| 2011/0024791 A1* | 2/2011 | Schulze | .............. | H01L 29/0834 |
| | | | | 257/107 |
| 2011/0101416 A1* | 5/2011 | Schulze | .............. | H01L 29/7397 |
| | | | | 257/139 |
| 2011/0127576 A1* | 6/2011 | Schulze | .............. | H01L 29/7428 |
| | | | | 257/164 |
| 2011/0180870 A1* | 7/2011 | Pendharkar | ......... | H01L 29/1016 |
| | | | | 257/337 |
| 2012/0267679 A1* | 10/2012 | Menard | ................... | H01L 29/87 |
| | | | | 257/109 |
| 2013/0115739 A1* | 5/2013 | Akiyama | ............ | H01L 29/7455 |
| | | | | 438/137 |
| 2014/0077284 A1* | 3/2014 | Akiyama | ............ | H01L 29/7811 |
| | | | | 257/302 |
| 2015/0084094 A1* | 3/2015 | Menard | ............... | H01L 21/2807 |
| | | | | 257/154 |
| 2015/0279834 A1* | 10/2015 | Manouvrier | ........... | G02B 6/122 |
| | | | | 385/14 |
| 2015/0333068 A1* | 11/2015 | Toh | ................... | H01L 29/66363 |
| | | | | 257/107 |
| 2015/0349101 A1* | 12/2015 | Bobde | ............... | H01L 21/26513 |
| | | | | 257/139 |

* cited by examiner

VERTICAL THYRISTOR

PRIORITY CLAIM

This application claims the priority benefit of French Application for Patent No. 1873566, filed on Dec. 20, 2018, the content of which is hereby incorporated by reference in its entirety to the maximum extent allowable by law.

TECHNICAL FIELD

The present disclosure concerns semiconductor power components, and more particularly aims at a vertical thyristor.

BACKGROUND

Various thyristor structures are known in the art.

There is, however, a need for a thyristor structure that will overcome all or part of the disadvantages of the known structures.

SUMMARY

In an embodiment, a thyristor comprises a vertical stack of first, second, third, and fourth semiconductor regions of alternated conductivity types, wherein the fourth region is interrupted in a gate area of the thyristor, and in a continuous corridor extending from said gate area towards a lateral edge of the fourth region.

According to an embodiment, the continuous corridor extends along a length greater than or equal to half the distance separating said gate area from said lateral edge of the fourth region.

According to an embodiment, the continuous corridor extends all the way to said lateral edge of the fourth region.

According to an embodiment, the continuous corridor has a substantially constant width in the longitudinal direction of the corridor.

According to an embodiment, the continuous corridor has, starting from said gate region, a decreasing width in the longitudinal direction of the corridor.

According to an embodiment, the thyristor comprises a first main conduction metallization in contact with the surface of the fourth semiconductor region opposite to the third semiconductor region.

According to an embodiment, the first metallization covers said continuous corridor, a portion of insulating layer being arranged between the first metallization and the upper surface of the continuous corridor, all along the corridor length.

According to an embodiment, the first metallization is interrupted opposite said continuous corridor, all along the corridor length.

According to an embodiment, the fourth semiconductor region is interrupted in emitter short-circuit areas where the upper surface of the third semiconductor region comes into contact with the first metallization.

According to an embodiment, the thyristor further comprises a gate metallization in contact with the third semiconductor region in said gate area.

According to an embodiment, the thyristor further comprises a second main conduction metallization in contact with the surface of the first semiconductor region opposite to the second semiconductor region.

According to an embodiment, the fourth semiconductor region is further interrupted in at least one additional continuous corridor extending from said gate area towards a lateral edge of the fourth semiconductor region.

According to an embodiment, said gate region is totally laterally surrounded with the fourth semiconductor region.

According to an embodiment, the continuous corridor and said at least one additional continuous corridor each extend all the way to a lateral edge of the fourth semiconductor region, so that the fourth semiconductor region is divided into at least two separate portions.

According to an embodiment, the first, second, third, and fourth semiconductor regions respectively are of type P, N, P, and N.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1A:
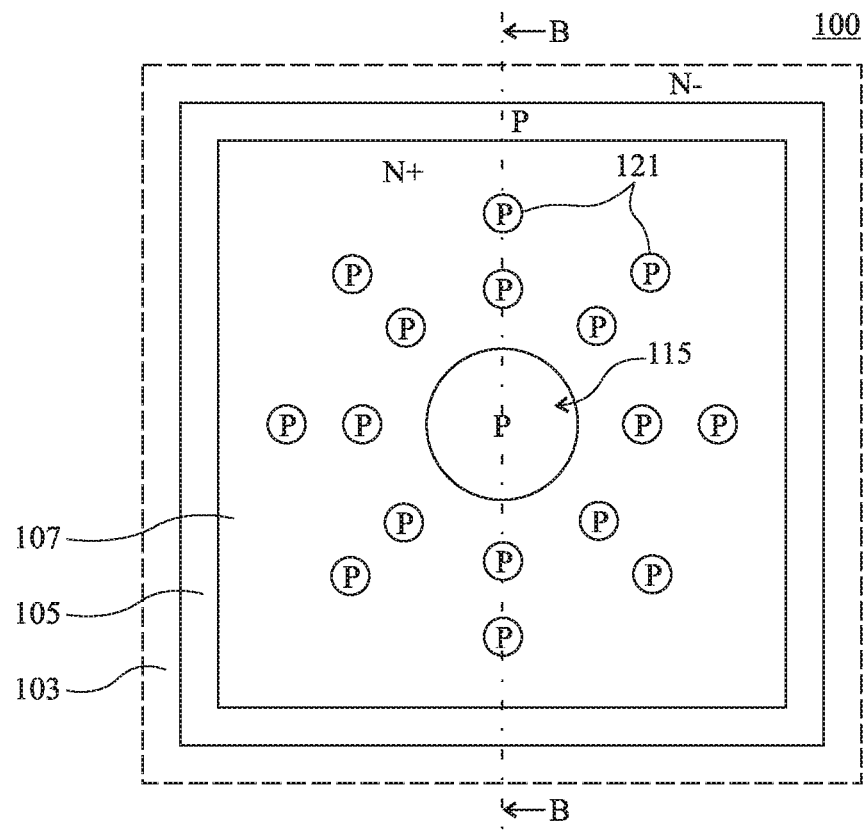
FIGS. 1A-1B schematically and partially show an example of a thyristor structure.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the manufacturing of the thyristors described hereafter has not been detailed, the manufacturing of such thyristors being within the abilities of those skilled in the art based on the indications of the present description. Further, the different junction termination structures which may be provided at the thyristor periphery have not been detailed, the described embodiments being compatible with all or part of known peripheral junction termination structures.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "rear", "top", "bottom", "left", "right", etc., or relative positions, such as terms "above", "under", "upper", "lower", "lateral", etc., or to terms qualifying directions, such as terms "horizontal", "vertical", "lateral", etc., unless otherwise specified, it is referred to the orientation of the cross-section views of the drawings, it being understood that, in practice, the described devices may be oriented differently.

The terms "about", "substantially", and "approximately" are used herein to designate a tolerance of plus or minus 10%, preferably of plus or minus 5%, of the value in question.

In the present description, the term power thyristor designates a thyristor capable of withstanding, in the off state, between its main electrodes (anode and cathode), a relatively high voltage, for example, a voltage of at least 600 volts, and preferably a voltage of at least 800 volts, and/or capable of withstanding, in the on state, between its main electrodes, a relatively high current, for example, a current of at least 30 amperes, and preferably a current of at least 50 amperes.

Figure 1B:
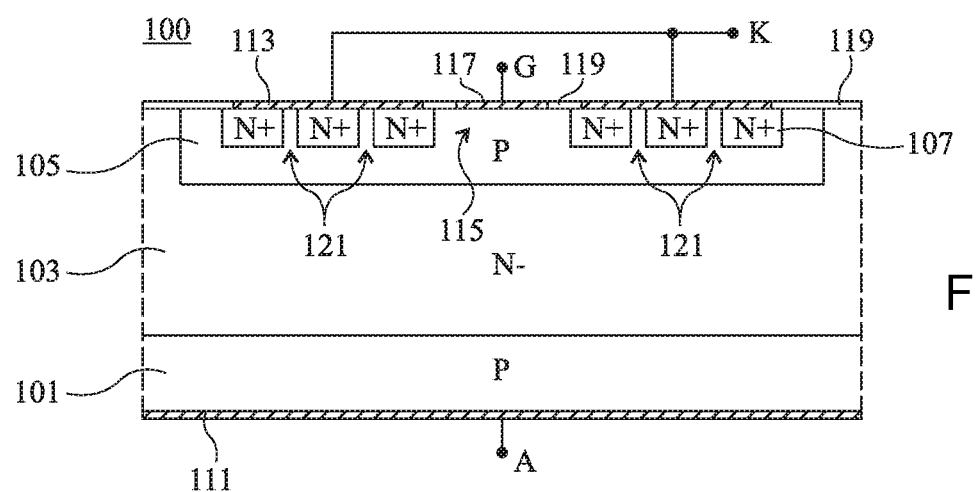

FIGS. 1A-1B schematically and partially show an example of a power thyristor 100. FIG. 1A more particularly comprises a top view of the thyristor, and FIG. 1B more particularly comprises a cross section view of the thyristor along plane B-B of FIG. 1A. For clarity, upper contact metallizations and an upper passivation layer of thyristor 100, visible in cross section view of FIG. 1B, have not been shown in top view of FIG. 1A.

Thyristor 100 comprises a vertical stack of four regions and/or of semiconductor layers 101, 103, 105, and 107 of alternated conductivity types. Regions 101, 103, 105, and 107 are, for example, made of silicon. In the example of FIG. 1, regions 101, 103, 105, and 107 are respectively P, N, P, and N-type doped. In this example, region 101 is an uninterrupted continuous layer extending over the entire component surface. As an example, the thickness of the layer for region 101 is in the range from 30 to 80 µm, for example, in the order of 50 µm. The P-type doping of the layer for region 101 is, for example, in the range from $10^{16}$ to $5*10^{19}$ atoms/cm$^3$. Region 103 is, in this example, an uninterrupted continuous layer extending on top of and in contact with the entire upper surface of the layer for region 101. As an example, the thickness of the layer for region 103 is in the range from 50 to 300 µm, for example, in the order of 150 µm. The N-type doping level of the layer for region 103 may be relatively low (N−), for example, in the range from $10^{13}$ to $10^{15}$ atoms/cm$^3$. In this example, region 105 extends in an upper portion of the layer for region 103. In top view, region 105 is located in a central portion of the layer for region 103. In other words, laterally, region 105 does not extend all the way to the edges of region 103 and is therefore laterally bounded by a peripheral portion of layer for region 105. The thickness of region 105 is, for example, in the range from 30 to 80 µm, for example, in the order of 50 µm. The P-type doping level of region 105 is, for example, in the range from $10^{16}$ to $5*10^{19}$ atoms/cm$^3$. In this example, region 107 extends in an upper portion of region 105. In top view, region 107 is located in a central portion of region 105. In other words, laterally, region 107 does not extend all the way to the edges of region 105. The thickness of region 107 is for example in the range from 10 to 30 µm, for example, in the order of 15 µm. The N-type doping level of region 107 may be relatively high (N+), for example, in the order of $10^{20}$ atoms/cm$^3$.

Thyristor 100 comprises an anode contact metallization 111 (A) arranged on top of and in contact with the lower surface of layer 101. Metallization 111, for example, extends over the entire lower surface of layer 101. Thyristor 100 further comprises a cathode contact metallization 113 (K) arranged on top of and in contact with the upper surface of region 107. Metallization 113, for example, extends over all of the upper surface of region 107.

In the example of FIGS. 1A-1B, region 107 is interrupted in an area 115 of region 105 located, in top view, in a central portion of the thyristor. In area 115, called the gate area, P-type region 105 is flush with the upper surface of N-type region 107. In this example, area 115 is totally laterally surrounded with region 107. Cathode contact metallization 113 is interrupted opposite the surface of area 115. Thyristor 100 further comprises, above area 115, a gate contact metallization 117 (G) arranged on top of and in contact with the upper surface of area 115 of region 105, wherein metallization 117 is electrically insulated from cathode contact metallization 113. In this example, gate contact metallization 117 is totally surrounded, laterally, by cathode contact metallization 113. In top view, gate area 115 for example has a circular shape. As an example, gate area 115 has a lateral dimension (width or diameter) in the range from 500 to 1,500 µm.

The portions of the upper surface of the semiconductor structure which are not coated with gate and cathode contact metallizations 117 and 113 may be coated with an insulating passivation layer 119, for example, made of silicon oxide. In the example of FIGS. 1A-1B, layer 119 covers a peripheral ring-shaped strip of region 105 surrounding, in top view, region 107, and a peripheral ring-shaped strip of region 103 surrounding, in top view, region 105. Further, in this example, layer 119 covers a ring-shaped semiconductor strip extending, in top view, between gate contact metallization 117 and cathode contact metallization 113.

In the example of FIGS. 1A-1B, region 107 is further interrupted in areas 121 where P-type region 105 comes into contact, by its upper surface, with cathode contact metallization 113. Areas 121, called emitter short circuits, or emitter short-circuit holes, enable to improve the dV/dt behavior characteristics of the thyristor, thus decreasing the risk of untimely turning-on of the thyristor by voltage peaks. In top view, areas 121 for example have a circular shape. As an example, emitter short-circuit areas 121 have a lateral dimension (width or diameter) in the range from 10 to 100 µm.

Figure 2:
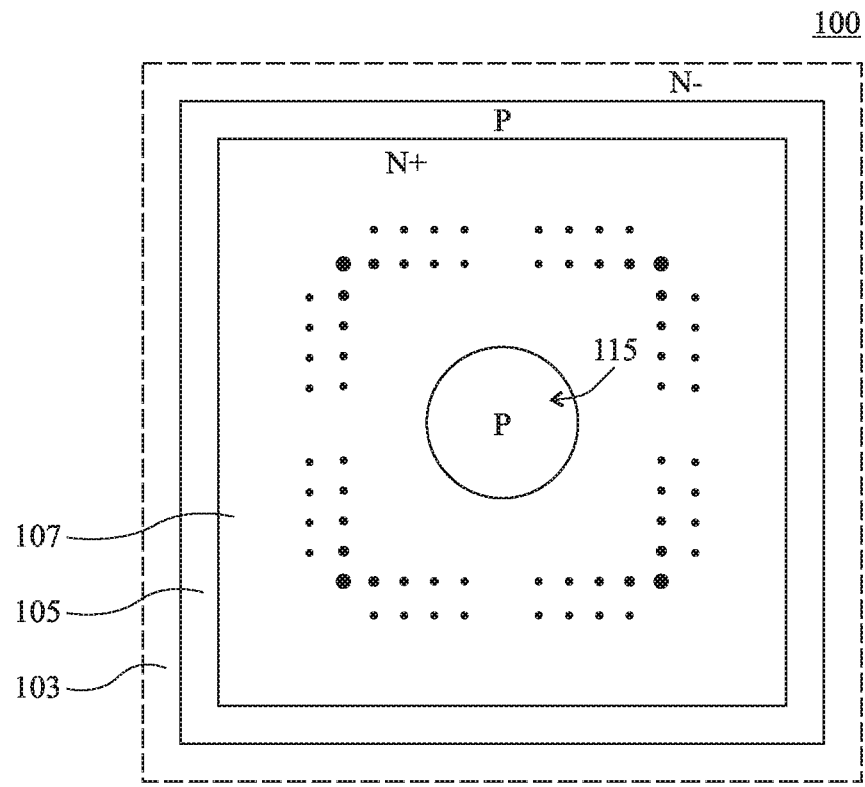
FIG. 2 is a top view schematically illustrating the temperature behavior of a thyristor of the type described in relation with FIGS. 1A-1B.

FIG. 2 is a top view of thyristor 100 similar to the view shown in FIG. 1A (that is, without gate and cathode contact metallizations 117 and 113 and without passivation layer 119) schematically illustrating the temperature behavior of such a thyristor. For clarity, emitter short circuit holes 121 have not been shown in FIG. 2.

FIG. 2 shows a very simplified and partial heat mapping of the upper surface of thyristor 100 in conduction phase, for example, just after a switching of the thyristor from the off state to the on state. The black dots in FIG. 2 correspond to hot spots of the upper surface of the thyristor, it being understood that the temperature measured at the level of the spots is all the higher as the diameter of the dots is large.

It can be observed that the hot spots, which correspond to areas of relatively high concentration of charge carriers in region 107, are relatively evenly distributed all around gate area 115.

Thyristor 100 of FIGS. 1A-1B may correspond to a discrete chip intended to be assembled in a power package (not shown) leaving access to three conductive connection terminals or tabs respectively connected, inside of the package, to anode contact metallization 111, to cathode contact metallization 113, and to gate contact metallization 117 of the chip.

Each of metallizations 113 and 117 of the chip may be connected to the corresponding cathode or gate connection terminal of the package by one or a plurality of conductive wires, for example, made of aluminum, soldered to the upper surface of the metallization. As an example, gate contact metallization 117 is connected to the gate connection terminal of the package by a single conductive wire soldered to the upper surface of metallization 117, and cathode contact metallization 113 is connected to the cathode connection terminal of the package by a plurality of conductive wires connected in parallel, soldered to the upper surface of metallization 113. Anode contact metallization 111 of the chip may be in contact, by its lower surface, with a conductive pad of the package, connected to the anode connection terminal of the package.

To provide a good heat dissipation and a fast turning on of the thyristor, it is preferable to solder the connection wire(s) of cathode contact metallization 113 at the level of hot spot areas of metallization 113.

However, due to the relatively homogeneous distribution of the hot spots around gate region 115, it is difficult, or even impossible, to solder conductive wires to all the hot spot areas of cathode contact metallization 113. Such a connection difficulty is amplified in the present example due to the central position of gate region 115, which implies the running of a conductive wire above a portion of metallization 113.

Figure 3:
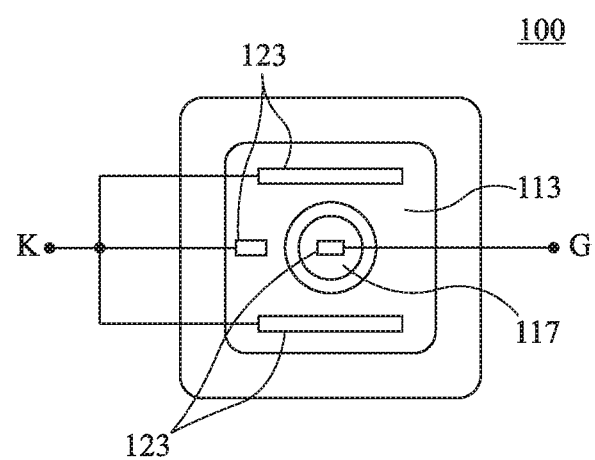
FIG. 3 is a top view schematically illustrating an example of connection of a thyristor of the type described in relation with FIGS. 1A-1B to an external device.

FIG. 3 is a simplified top view of thyristor 100, illustrating a possible example of layout of connection conductive wires on the upper surface of metallizations 113 and 117.

FIG. 3 schematically shows, in the form of rectangles, areas 123 of the upper surfaces of metallizations 113 and 117 to which conductive wires may be soldered. On each of these areas, it is provided in the present example to solder a single conductive wire, the surface of the soldering of the wire to the metallization extending over substantially the entire surface of the area. In the example of FIG. 3, a single area 123 is provided on gate contact metallization 117 and three areas 123 are provided on cathode contact metallization 113. It is thus provided to solder a single conductive wire to gate contact metallization 117, and three conductive wires to cathode contact metallization 113. The three areas 123 of soldering of the conductive wires to cathode contact metallization 113 are respectively arranged, in the orientation of FIG. 3, in an upper portion of metallization 113, in a lower portion of metallization 113, and in a left-hand portion of metallization 113.

A disadvantage of such a configuration is that certain hot spot areas of metallization 113 remain located outside of the areas of soldering of the conductive wires to metallization 113 (for example, in the right-hand portion of the chip in the example of FIG. 3). This limits the thyristor performance, particularly in terms of heat dissipation and of turn-on speed, but also in terms of the maximum current that the thyristor can withstand for a given active chip surface area. Further, the soldering of four conductive wires to the upper surface of the thyristor is relatively difficult to implement due to the relative small surface area of the chip (for example, in the range from 10 to 100 mm$^2$) and due to the issue of the crossing of the cathode and gate wires.

Figure 4A:
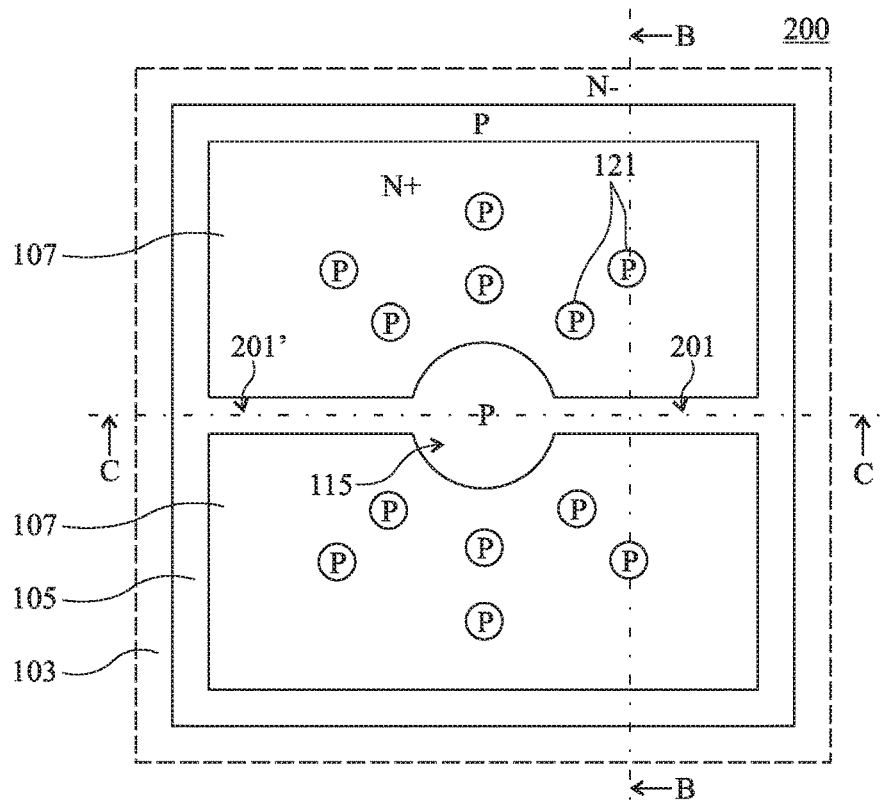
FIGS. 4A-4C schematically and partially show an example of a thyristor structure according to an embodiment.
Figure 4B:
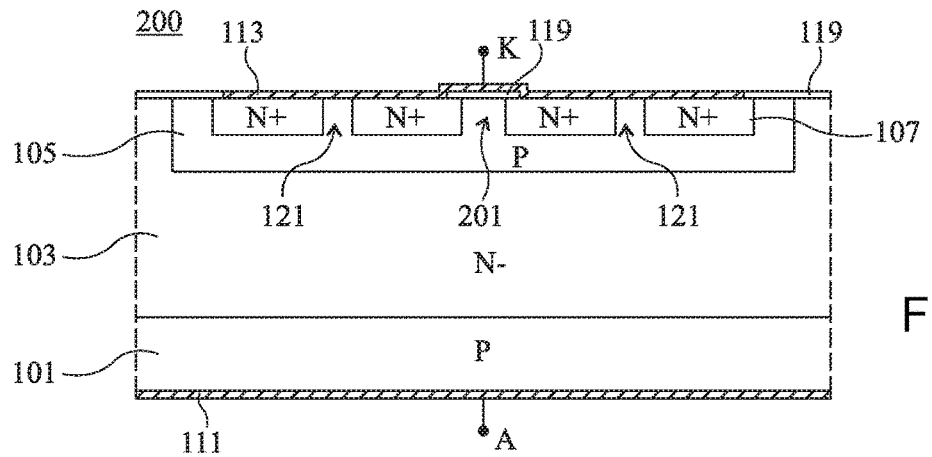
Figure 4C:
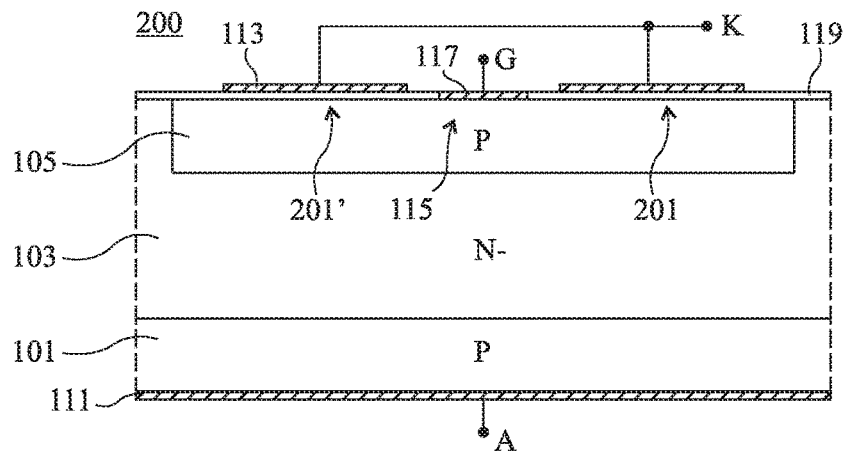

FIGS. 4A-4C schematically and partially show an example of a power thyristor 200 according to an embodiment. FIG. 4A more particularly comprises a top view of the thyristor, FIG. 4B more particularly comprises a cross-section view of the thyristor along plane B-B of FIG. 4A, and FIG. 4C more particularly comprises a cross-section view of the thyristor along plane C-C of FIG. 4A. For clarity, upper contact metallizations and an upper passivation layer of thyristor 200, shown on cross-section views of FIGS. 4B-4C, have not been shown in top view of FIG. 4A.

Thyristor 200 of FIGS. 4A-4C comprises elements common with thyristor 100 of FIGS. 1A-1B. These elements will not be described again hereafter. Hereafter, only the differences with respect to thyristors 100 of FIGS. 1A-1B will be highlighted.

Thyristor 200 of FIGS. 4A-4C differs from thyristor 100 of FIGS. 1A-1B mainly in that, in thyristor 200, region 107 is interrupted in an area 201 forming, in top view, a continuous corridor extending from an edge of gate area 115 to a lateral edge (in the present example, the right-hand edge in the orientation of the view shown by FIG. 4A) of region 107. In the example of FIGS. 4A-4C, region 107 is further interrupted in an area 201' forming, in top view, a second continuous corridor extending from one edge of gate area 115 to a lateral edge (in the present example, the left hand edge in the orientation of the view shown in FIG. 4A) of region 107.

In each of corridors 201 and 201', P-type region 1005 is flush with the upper surface of N-type region 107, along the entire length of the corridor.

In the example of FIGS. 4A-4C, in top view, corridor 201' corresponds to the symmetrical of corridor 201 with respect to the center of gate area 115. Corridors 201 and 201' thus have a common longitudinal axis, substantially horizontal in the orientation of the view in FIG. 4A. In this example, corridors 201 and 201' form with gate region 115 a continuous area of interruption of region 107, separating region 107 into two separate regions, for example, having the same surface area.

FIG. 4B shows a transverse cross-section view of corridor 201, and FIG. 4C shows a longitudinal cross-section view of corridors 201 and 201'.

Each of corridors 201 and 201' for example has a width (vertical dimension in the orientation of the view of FIG. 4A and horizontal dimension in the orientation of the view of FIG. 4B) in the range from 50 to 200 µm. In this example, the width of each corridor is substantially constant in the longitudinal direction of the corridor.

In the example of FIGS. 4A-4C, above each of corridors 201 and 201', a strip-shaped portion of insulating layer 119 is arranged on top of and in contact with the upper surface of region 105, along substantially the entire length of the corridor. Layer 119 insulates cathode contact metallization 113 from region 105 at the level of the upper surface of corridors 201 and 201'. In this example, metallization 113 is not interrupted at the level of corridors 201 and 201'. Thus, in top view, metallization 113 has substantially the same shape as in the example of FIGS. 1A-1B, that is, the shape of a full plate provided with a central opening opposite gate region 115 of the thyristor.

Figure 5:
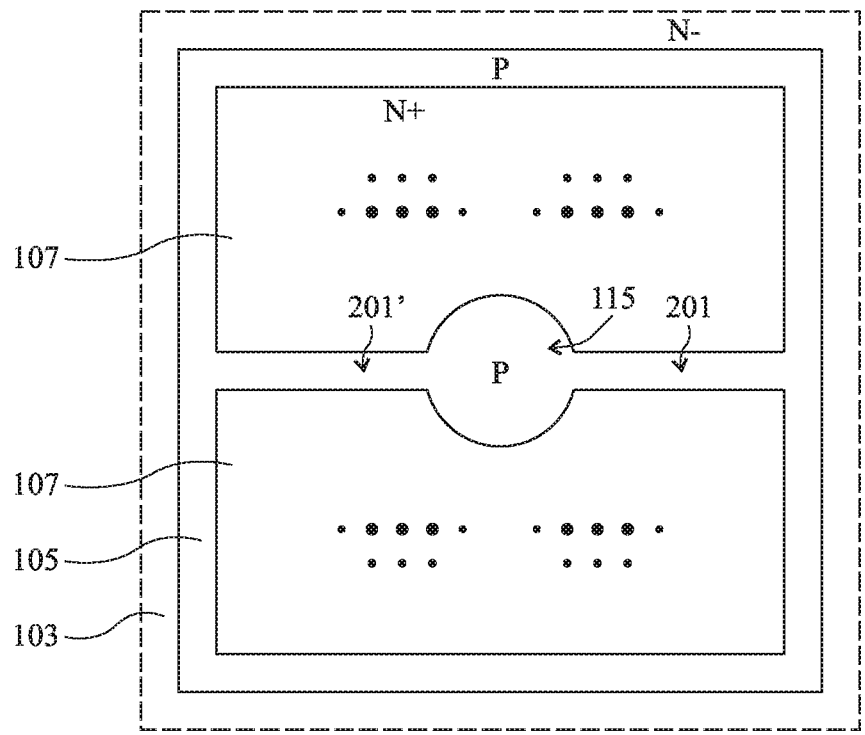
FIG. 5 is a top view schematically illustrating the temperature behavior of a thyristor of the type described in relation with FIG. 4.

FIG. 5 is a top view of thyristor 200 of FIGS. 4A-4C similar to the view of FIG. 4A (that is, without gate and cathode contact metallizations 117 and 113 and without passivation layer 119), schematically illustrating the temperature behavior of such a thyristor. For clarity, emitter short-circuit holes 121 have not been shown in FIG. 5.

FIG. 5 shows a very simplified and partial heat mapping of the upper surface of thyristor 200 in conduction phase, for example, just after a switching of the thyristor from the off state to the on state. As in FIG. 2, the black dots in FIG. 5 correspond to hot spots of the upper surface of the thyristor, it being understood that the temperature measured at the level of these spots is all the higher as the diameter of the dots is large.

It can this time be observed that the hot spots, which correspond to areas of relatively high concentration of charge carriers in region 107, are concentrated in two areas substantially symmetrical with respect to the central longitudinal axis of corridors 201 and 201' of interruption of region 107.

As compared with thyristor 100 where the hot spots are evenly distributed all around central gate area 115, this advantageously enables to ease the soldering of conductive wires all over the surface of the hot spot areas of cathode contact metallization 113.

Figure 6:
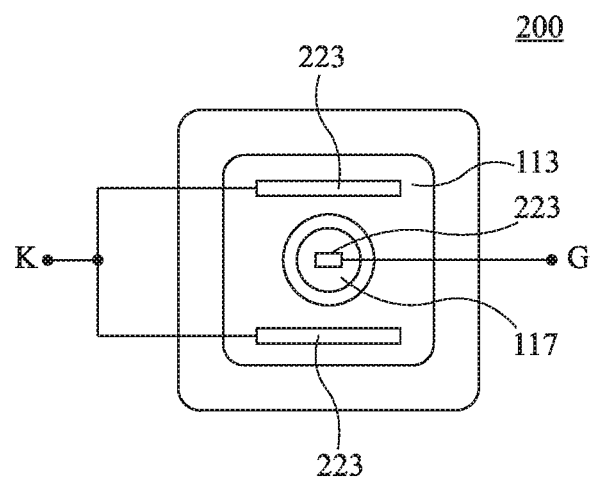
FIG. 6 is a top view schematically illustrating an example of connection of a thyristor of the type described in relation with FIG. 4 to an external device.

FIG. 6 is a simplified top view of thyristor 200, illustrating a possible example of layout of connection conductive wires on the upper surface of metallizations 113 and 117.

FIG. 6 schematically shows, in the form of rectangles, areas 223 of the upper surfaces of metallizations 113 and 117 to which conductive wires may be soldered. On each of these areas, it is provided in the present example to solder a single conductive wire, the surface of the soldering of the wire to the metallization extending over substantially the entire surface of the area. In the example of FIG. 6 a single area 223 is provided on gate contact metallization 117 and two areas 223 are provided on cathode contact metallization 113. It is thus provided to solder a single conductive wire to gate contact metallization 117 and two conductive wires to cathode contact metallization 113. The two areas 223 of soldering of the conductive wires to cathode contact metallization 113 are respectively arranged on either side of the longitudinal axis of corridors 201 and 201' of interruption of region 107 (not shown in FIG. 6), that is, in the orientation of FIG. 6, in an upper portion of metallization 113 and in a lower portion of metallization 113.

The measurements performed have shown that the configuration of FIG. 6 provides higher static and dynamic performance than the configuration of FIG. 3, and this, with one less wire to be soldered to the upper surface of the cathode contact metallization. In particular, the configuration of FIG. 6 provides a better heat dissipation and a faster turning-on of the thyristor than in the configuration of FIG. 3. It should further be noted that for a targeted on-state breakdown current value, the active surface area of the thyristor may be decreased by from approximately 3 to 5% in the configuration of FIG. 6 with respect to the configuration of FIG. 3.

Figure 7A:
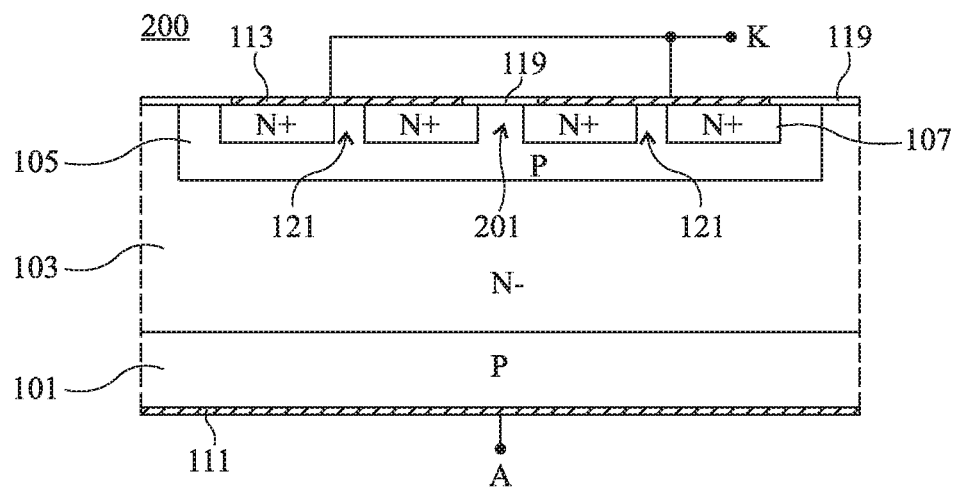
FIGS. 7A-7B schematically and partially show an alternative embodiment of the thyristor of FIGS. 4A-4C.
Figure 7B:
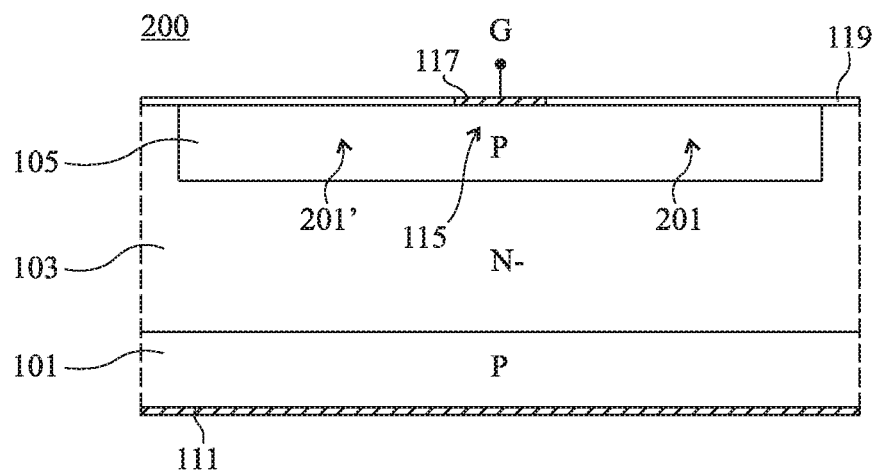

FIGS. 7A-7B schematically and partially show an alternative embodiment of thyristor 200 of FIGS. 4A-4C. FIG. 7A comprises a view in the same plane as the view of FIG. 4B and FIG. 7B comprises a view in the same plane as the view of FIG. 4C.

The thyristor of FIGS. 7A-7B differs from the thyristor of FIGS. 4A-4C mainly in that, in the example of FIGS. 7A-7B, cathode contact metallization 113 is interrupted opposite corridors 201 and 201', all along the length of corridors 201 and 201'. Thus, in the present example, metallization 113 is divided into two separate portions substantially having the same surface area, intended to be connected to a same connection terminal of the chip package.

In the shown example, in each of corridors 201 and 201', the upper surface of region 105 is coated with a portion of insulating layer 119 extending all along the length of the corridor. As a variation, insulating layer portions 119 may be omitted, the upper surface of corridors 201 and 201' being then left exposed.

Figure 8:
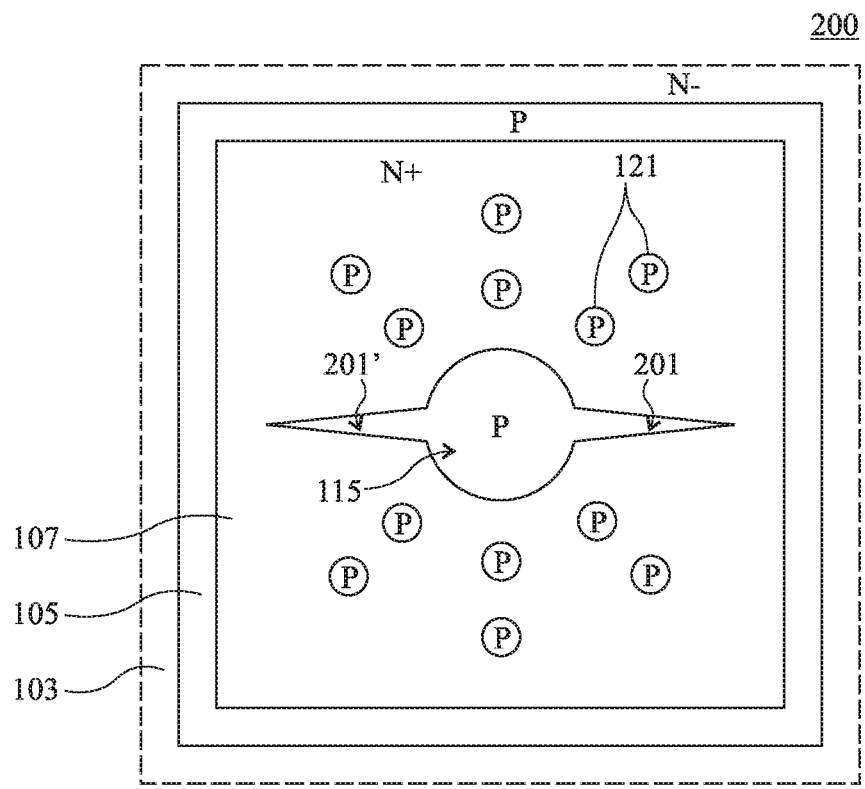
FIG. 8 schematically and partially shows another alternative embodiment of the thyristor of FIGS. 4A-4C.

FIG. 8 is a simplified and partial top view illustrating another alternative embodiment of thyristor 200 of FIGS. 4A-4C.

The thyristor of FIG. 8 differs from the thyristor of FIGS. 4A-4C mainly in that, in the example of FIG. 8, corridors 201 and 201' do not extend all the way to lateral edges of semiconductor region 107. More particularly, in the example of FIG. 8, each of corridors 201 and 201' extends from gate region 115 towards a lateral edge of semiconductor region 107, but is interrupted before reaching the edge of semiconductor region 107. The tests performed have indeed shown that the above-described advantages can be obtained with corridors which do not extend all the way to the lateral edges of semiconductor region 107. Preferably, each corridor extends lengthwise over at least half the distance separating gate region 115 from the lateral edge of semiconductor region 107.

Further, in the example of FIG. 8, unlike the example described in relation with FIGS. 4A-4C, each of corridors 201 and 201' has a width which varies in the longitudinal direction of the corridor. More particularly, in this example, the width of each corridor decreases, for example, continuously, as the distance to gate region 115 increases. As a variation, each of corridors 201 and 201' of the thyristor of FIG. 8 may have a substantially constant width in the longitudinal direction of the corridor. In another variation, each of corridors 201 and 201' of the thyristor of FIGS. 4A-4C or FIGS. 7A-7B may have a variable width in the longitudinal direction of the corridor, for example, a width which decreases as the distance to gate region 115 increases.

Various embodiments and variations have been described. It will be understood by those skilled in the art that certain features of the various embodiments and variations may be combined, and other variations will occur to those skilled in the art. In particular, the described embodiments are not limited to the example described in relation with FIGS. 4A to 8 of a thyristor comprising two corridors of interruption of region 107, separating region 107 into two separate portions. As a variation, the thyristor may comprise a single corridor extending from gate region 115 towards a lateral edge of region 107, for example, to a lateral edge of region 107. The provision of a single corridor enables to concentrate the hot spots in an area only partially surrounding the gate region. In another variation, the thyristor may comprise more than two corridors, each extending from central gate region 115 towards a lateral edge of region 107, for example, all the way to a lateral edge of region 107, in which case region 107 is divided into more than two separate portions.

Further, although only embodiments concerning thyristors with a central gate, that is, where gate region 115 is totally laterally surrounded with region 107 and gate metallization 117 is totally laterally surrounded with conduction metallization 113, have been shown in the drawings, the described embodiments are not limited to this specific case. As a variation, the described embodiments may be adapted to thyristors where the gate is located at the periphery of region 107, for example, at the level of a lateral edge of region 107 or at the level of a corner of region 107. In this case, gate region 115 is only partially laterally surrounded with region 107, and gate metallization 117 is only partially laterally surrounded with conduction metallization 113. The tests performed have indeed shown that advantages similar to those described hereabove, particularly in terms of heat dissipation, of turn-on speed, and of active surface area decrease, can be obtained by providing one or a plurality of corridors of interruption of region 107 in thyristors with a peripheral gate.

Further, the described embodiments are not limited to the examples of number and of arrangement of emitter short circuit holes 121 shown in the drawings. As a variation, emitter short circuit holes 121 may be omitted.

Further, the described embodiments are not limited to the specific example of layout of the wires of connection of conduction metallization 113 to an external device shown in FIG. 6. As a variation, the number of wires of connection of metallization 113 to an external device may be different from two. Further, the orientation of the wires of connection of metallization 113 to an external device may be different from what has been shown. As an example, the wires of connection of metallization 113 to an external device may have a transverse orientation, that is, substantially orthogonal to the longitudinal axis of corridors 201, 201'.

Further, the described embodiments are not limited to the examples of numerical values and of materials mentioned in the present disclosure.

Further, a thyristor having advantages similar to what has been described in relation with FIGS. 4A to 8 may be obtained by inverting all the conductivity types of regions 101, 103, 105, and 107.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A thyristor, comprising:
a vertical stack of first, second, third, and fourth semiconductor regions of alternated conductivity types;
wherein the fourth semiconductor region is interrupted by a portion of the third semiconductor region forming a gate area of the thyristor;
a gate metallization in contact with an upper surface of the third semiconductor region in the gate area; and
wherein the fourth semiconductor region is further interrupted by another portion of the third semiconductor region forming a continuous corridor extending longitudinally away from a location where said gate metallization makes contact with the third semiconductor region towards a lateral edge of the fourth semiconductor region; and
wherein an upper surface of the another portion of the third semiconductor region is flush with an upper surface of the fourth semiconductor region and said upper surface of the another portion continuously extends along an entire length of the continuous corridor from said location towards said lateral edge.

2. The thyristor of claim 1, wherein the entire length of the continuous corridor is greater than or equal to half a distance from said location where said gate metallization makes contact with the third semiconductor region to said lateral edge of the fourth semiconductor region.

3. The thyristor of claim 1, wherein the entire length of the continuous corridor extends from said location where said gate metallization makes contact with the third semiconductor region all the way to the lateral edge of the fourth semiconductor region.

4. The thyristor of claim 1, wherein the upper surface of the another portion has a substantially constant lateral width along a direction that the continuous corridor longitudinally extends.

5. The thyristor of claim 1, wherein the upper surface of the another portion has, starting from said location where said gate metallization makes contact with the third semiconductor region, a decreasing lateral width along a direction that the continuous corridor longitudinally extends.

6. The thyristor of claim 1, further comprising a first main conduction metallization in contact with the surface of the fourth semiconductor region opposite to the third semiconductor region.

7. The thyristor of claim 6, wherein the first main conduction metallization covers said continuous corridor, and further including an insulating layer wherein a portion of the insulating layer is arranged between the first main conduction metallization and an upper surface of the continuous corridor, the insulating layer extending along all of the entire length of the continuous corridor.

8. The thyristor of claim 6, wherein the first main conduction metallization is interrupted opposite said continuous corridor, along all of the entire length of the continuous corridor.

9. The thyristor of claim 6, wherein the fourth semiconductor region is interrupted by additional portions of the third semiconductor region forming emitter short circuit areas where the upper surface of the third semiconductor region makes contact with the first main conduction metallization.

10. The thyristor of claim 1, further comprising a second main conduction metallization in contact with the surface of the first semiconductor region opposite to the second semiconductor region.

11. The thyristor of claim 1, wherein the fourth semiconductor region is still further interrupted by an additional portion of the third semiconductor region forming a further continuous corridor extending longitudinally away from the location where said gate metallization makes contact with the third semiconductor region towards an opposite lateral edge of the fourth semiconductor region, wherein an upper surface of the additional portion of the third semiconductor region is flush with the upper surface of the fourth semiconductor region and said upper surface of the additional portion continuously extends along an entire length of the further continuous corridor from said location towards said opposite lateral edge.

12. The thyristor of claim 11:
wherein said location where said gate metallization makes contact with the third semiconductor region is laterally surrounded with the fourth semiconductor region and the continuous corridor and said further continuous corridor; and
wherein the entire length of the continuous corridor and the entire length of said further continuous corridor each extend from said location where said gate metallization makes contact with the third semiconductor region all the way to the lateral edge of the fourth semiconductor region and the opposite lateral edge of the fourth semiconductor region, respectively, so that the fourth semiconductor region is divided into at least two separate portions.

13. The thyristor of claim 1, wherein said location where said gate metallization makes contact with the third semiconductor region is laterally surrounded with the fourth semiconductor region and the continuous corridor.

14. The thyristor of claim 1, wherein the first, second, third, and fourth semiconductor regions are respectively of type P, N, P, and N.

15. A thyristor, comprising:
a vertical stack of first, second, third, and fourth semiconductor regions of alternated conductivity types;

a first interruption of the fourth semiconductor region that is filled by a first portion of the third semiconductor region to form a thyristor gate area;

a second interruption of the fourth semiconductor region that is filled by a second portion of the third semiconductor region to form a corridor area, said second interruption being connected to the first interruption;

a gate metal layer in contact with an upper surface of the first portion of the third semiconductor region but which does not extend over an upper surface of the second portion of the third semiconductor region;

wherein the upper surface of the second portion of the third semiconductor region is flush with an upper surface of the fourth semiconductor region;

wherein the upper surface of the second portion of the third semiconductor region continuously extends along an entire length of the corridor area longitudinally away from a location where said gate metal layer makes contact with the upper surface of the first portion towards an outer edge of the fourth semiconductor region; and a cathode metal layer in contact with an upper surface of the fourth semiconductor region but which is insulated from the upper surfaces of the first and second portions of the third semiconductor region.

16. The thyristor of claim 15, wherein the entire length of the corridor area from said location towards the outer edge of the third semiconductor region is greater than or equal to half a distance from said location to said outer edge.

17. The thyristor of claim 16, wherein a width of the upper surface of the second portion is constant along said entire length of the corridor area towards the outer edge.

18. The thyristor of claim 16, wherein a width of the upper surface of the second portion narrows along said entire length towards the outer edge.

19. The thyristor of claim 15, wherein the entire length of the corridor area from said location towards the outer edge of the third semiconductor region is equal to a distance from said location to said outer edge.

20. The thyristor of claim 19, wherein a width of the upper surface of the second portion is constant along said entire length of the corridor area towards the outer edge.

21. The thyristor of claim 19, wherein a width of the upper surface of the second portion narrows along said entire length towards the outer edge.

22. The thyristor of claim 15, further comprising a third interruption of the fourth semiconductor region that is filled by a third portion of the third semiconductor region to form an emitter short-circuit area, and wherein said cathode metal layer is in contact with an upper surface of the third portion of the third semiconductor region.

23. The thyristor of claim 15, wherein the first, second, third, and fourth semiconductor regions are respectively of type P, N, P, and N.

24. The thyristor of claim 15, wherein the first and second interruptions of the fourth semiconductor region fully divide the fourth semiconductor region into two separate sub-regions.

25. The thyristor of claim 15, wherein the first interruption of the fourth semiconductor region is centrally located and the corridor area extends away from the location at the centrally located first interruption.

26. The thyristor of claim 1, wherein the gate area is centrally located and the corridor area extends away from the location at the centrally located gate area.

* * * * *